(12) United States Patent
Jackson et al.

(10) Patent No.: US 12,060,304 B2
(45) Date of Patent: *Aug. 13, 2024

(54) MICROSTRUCTURED FIBER INTERFACE COATINGS FOR COMPOSITES

(71) Applicant: RTX CORPORATION, Farmington, CT (US)

(72) Inventors: Richard Wesley Jackson, Mystic, CT (US); Ying She, Rocky Hill, CT (US); Gajawalli V. Srinivasan, South Windsor, CT (US)

(73) Assignee: RTX CORPORATION, Farmington, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/161,343

(22) Filed: Jan. 30, 2023

(65) Prior Publication Data

US 2023/0167030 A1 Jun. 1, 2023

Related U.S. Application Data

(63) Continuation of application No. 16/678,852, filed on Nov. 8, 2019, now Pat. No. 11,565,977.

(51) Int. Cl.
*C04B 35/80* (2006.01)
*C04B 35/628* (2006.01)
(Continued)

(52) U.S. Cl.
CPC ........ *C04B 35/80* (2013.01); *C04B 35/62849* (2013.01); *C04B 35/62863* (2013.01); *C04B 35/62884* (2013.01); *C04B 35/62894* (2013.01); *C04B 35/62897* (2013.01); *C23C 16/325* (2013.01); *C23C 16/56* (2013.01); *D06M 11/74* (2013.01); *D06M 11/79* (2013.01); *C04B 2235/5228* (2013.01);
(Continued)

(58) Field of Classification Search
CPC .............. C04B 35/80; C04B 35/62849; C04B 35/62863; C04B 35/62894; C04B 35/62897
See application file for complete search history.

(56) References Cited

U.S. PATENT DOCUMENTS 2,674,445 A * 4/1954 Diehl ................... C04B 20/061
    384/549
3,326,704 A * 6/1967 Scott ......................... C03C 3/06
    501/128
(Continued)

OTHER PUBLICATIONS

European Search Report for European Application No. 20206017.4; Application Filing Date: Nov. 5, 2020; dated Apr. 6, 2021; 7 pages.
(Continued)

*Primary Examiner* — Alex B Efta
(74) *Attorney, Agent, or Firm* — CANTOR COLBURN LLP

(57) ABSTRACT

Disclosed is a coated ceramic fiber including a silicon carbide coating layer adjacent to the ceramic fiber and a silicon dioxide coating layer adjacent to the silicon carbide coating layer, wherein the silicon dioxide coating layer forms micro cracks after a crystal structure transformation. The coated ceramic fiber may be included in a composite material having a ceramic matrix.

13 Claims, 1 Drawing Sheet

(51) Int. Cl.
*C23C 16/32* (2006.01)
*C23C 16/56* (2006.01)
*D06M 11/74* (2006.01)
*D06M 11/79* (2006.01)

(52) U.S. Cl.
CPC ............... *C04B 2235/5232* (2013.01); *C04B 2235/524* (2013.01); *C04B 2235/5244* (2013.01)

(56) References Cited

U.S. PATENT DOCUMENTS

| | | | |
|---|---|---|---|
| 4,623,228 A | 11/1986 | Galasso et al. | |
| 4,668,579 A | 5/1987 | Strangman et al. | |
| 5,110,771 A | 5/1992 | Carpenter et al. | |
| 5,275,984 A | 1/1994 | Carpenter et al. | |
| 5,284,685 A | 2/1994 | Rousseau | |
| 5,455,106 A * | 10/1995 | Steffier | C04B 35/62897 442/127 |
| 5,580,643 A * | 12/1996 | Kennedy | C04B 35/62855 428/404 |
| 5,723,213 A * | 3/1998 | Carpenter | C04B 35/62884 428/408 |
| 6,194,083 B1 | 2/2001 | Yasuda et al. | |
| 6,322,889 B1 | 11/2001 | Lara-Curzio et al. | |
| 6,361,888 B1 * | 3/2002 | Kriven | B32B 18/00 428/404 |
| 6,441,341 B1 * | 8/2002 | Steibel | B23K 26/40 219/121.66 |
| 9,133,541 B2 | 9/2015 | Lee | |
| 11,565,977 B2 * | 1/2023 | Jackson | C04B 35/62884 |
| 2006/0163773 A1 * | 7/2006 | Gray | C04B 35/573 264/270 |
| 2015/0274979 A1 | 10/2015 | Lazur | |
| 2016/0376691 A1 | 12/2016 | Wadley et al. | |
| 2017/0218779 A1 * | 8/2017 | Luthra | C04B 41/85 |
| 2021/0139381 A1 | 5/2021 | Jackson et al. | |
| 2021/0139384 A1 | 5/2021 | Jackson et al. | |

OTHER PUBLICATIONS

European Search Report for European Application No. 20206025.7; Application Filing Date: Nov. 5, 2020; dated Apr. 8, 2021, 8 pages.
Piquero et al., "Influence of Carbide Coatings on the Oxidation Behavior of Carbon Fibers", Carbon, vol. 33, No. 4, pp. 455-467, 1995.
U.S. Non-Final Office Action for U.S. Appl. No. 16/678,833, dated Jan. 31, 2023, pp. 1-29.
US Final Office Action for U.S. Appl. No. 16/678,833; dated Feb. 7, 2024, 10 pages.

* cited by examiner

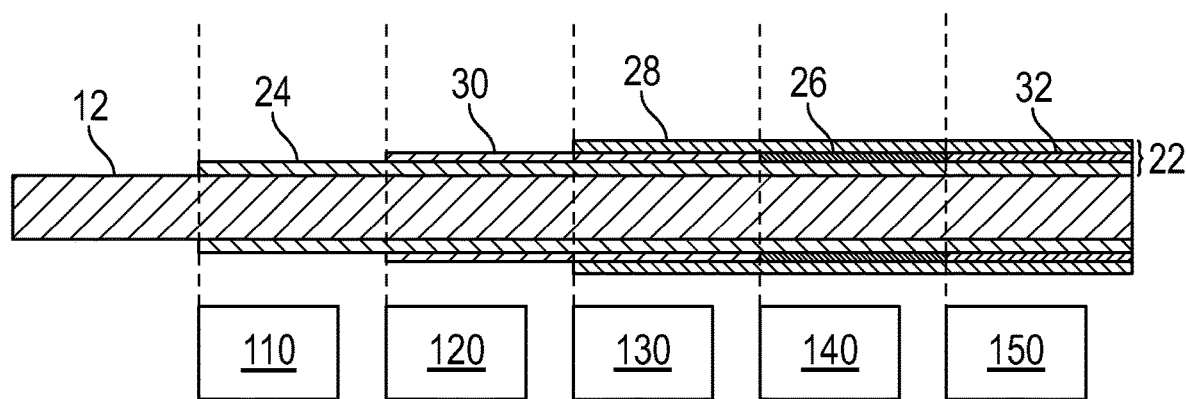

MICROSTRUCTURED FIBER INTERFACE COATINGS FOR COMPOSITES

CROSS-REFERENCE TO RELATED APPLICATIONS

This application is a continuation of U.S. application Ser. No. 16/678,852 filed Nov. 8, 2019, the disclosure of which is incorporated herein by reference in its entirety.

BACKGROUND

Exemplary embodiments pertain to the art of composites, including ceramic matrix composites.

Composite components are finding increased use into aerospace applications due to their unique, tailorable properties which can result in significant weight savings, increased performance and durability, as well as reductions in specific fuel consumption. In particular, gas turbine engines, such as aircraft engines, operate in severe environments and show significant benefit from incorporation of composite materials. Additionally, other aerospace components, such as brakes, can benefit from incorporating composite materials.

As an example, ceramic matrix composite (CMC) components have desirable high temperature mechanical, physical, and chemical properties which allow gas turbine engines to operate at much higher temperatures with significant weight savings as compared to current engines with superalloy components. As opposed to traditional, monolithic ceramics, CMCs exhibit a significant amount of damage tolerance when under an applied load. This damage tolerance is due in part to the formation of multiple matrix cracks that aid in the redistribution of stresses to the high strength fibers.

The formation of matrix cracks can extend to the fiber and damage to the fiber may negatively impact the strength of the composite. Interface coatings have been used to address this issue. As CMCs, along with many other composites, are used under harsh environmental conditions improved interface coatings are desired.

BRIEF DESCRIPTION

Disclosed is a coated ceramic fiber including a silicon carbide coating layer adjacent to the ceramic fiber and a silicon dioxide coating layer adjacent to the silicon carbide coating layer, wherein the silicon dioxide coating layer forms micro cracks after a crystal structure transformation.

In addition to one or more of the features described above, or as an alternative to any of the foregoing embodiments, the silicon dioxide coating layer has a thickness of 50 nanometers (nm) to 10,000 nm, or, 100 to 1,000 nm. Additionally, in some embodiments, the silicon carbide coating layer has a thickness of 1000 nm to 20,000 nm, or, 2,000 to 10,000 nm.

In addition to one or more of the features described above, or as an alternative to any of the foregoing embodiments, the silicon dioxide coating layer is in $\beta$ cristobalite form which forms micro cracks after transforming to a cristobalite form.

In addition to one or more of the features described above, or as an alternative to any of the foregoing embodiments, the coated ceramic fiber further includes an additional coating layer adjacent to the silicon dioxide coating layer. The additional coating layer composition can be the same as the silicon carbide coating layer or different from the silicon carbide coating layer.

Also disclosed is a composite material including a ceramic matrix material and a plurality of coated ceramic fibers embedded within the matrix material. The coating on the fibers is a multi-layer interface coating. The multi-layer interface coating includes a silicon carbide coating layer adjacent to the plurality of fibers, and a silicon dioxide coating layer adjacent to the silicon carbide coating layer, wherein the silicon dioxide coating layer has micro cracks resulting from a crystal structure transformation.

In addition to one or more of the features described above, or as an alternative to any of the foregoing embodiments, the silicon dioxide coating layer has a thickness of 50 nanometers (nm) to 10,000 nm, or, 100 to 1,000 nm. Additionally, in some embodiments, the silicon carbide coating layer has a thickness of 1000 nm to 20,000 nm, or, 2,000 to 10,000 nm.

In addition to one or more of the features described above, or as an alternative to any of the foregoing embodiments, the multi-layer interface coating includes an additional coating layer adjacent to the silicon dioxide coating layer. The additional coating layer can be silicon carbide coating layer.

Also disclosed is a method for forming a multi-layer interface coating onto a ceramic fiber including depositing a silicon carbide coating layer onto the fiber, oxidizing a portion of the silicon carbide coating layer to form a silicon dioxide coating layer, and crystallizing the silicon dioxide to beta cristobalite. The method may further include depositing an additional layer on the silicon dioxide coating layer.

BRIEF DESCRIPTION OF THE DRAWINGS

The following descriptions should not be considered limiting in any way. With reference to the accompanying drawings, like elements are numbered alike:

The FIGURE shows a representative interface coating and method of making.

DETAILED DESCRIPTION

A detailed description of one or more embodiments of the disclosed apparatus and method are presented herein by way of exemplification and not limitation with reference to the FIGURE.

Composites exhibit a significant amount of damage tolerance when under an applied load. In ceramic matrix composites (CMC) in particular, this damage tolerance is due to the formation of multiple matrix cracks that aid in the redistribution of stresses. However, the formation of matrix cracks can result in environmental exposure to the fiber and fiber interface coating. The fiber interface coating protects the fiber from the environmental exposure and provides a weak interface to allow for composite behavior.

The multi-layer interface coating described herein provides a weak interface with the fiber to allow for composite behavior and also provides environmental protection. The multiple layers can prevent crack propagation from reaching the fibers and protect the fiber from environmental degradation. In particular, the silicon dioxide layer is a crystalline material which goes through a crystal structure transformation after a heat treatment or under conditions of normal use. The crystal structure transformation results in the presence of micro cracks which can deflect any matrix cracks from reaching the fiber.

Referring now to the FIGURE a coated ceramic fiber for use in a composite is shown. The coated ceramic fiber includes ceramic fiber 12 and a multi-layer interface coating 22. The multi-layer interface coating 22 as shown includes three coating layers 24, 32 and 28. It should be appreciated that the additional coating layer 28 is optional. Exemplary ceramic fiber materials include silicon carbide, carbon, aluminum oxide, mullite, hafnium carbide, zirconium carbide, tantalum carbide, niobium carbide, boron carbide, titanium carbide, hafnium boride, zirconium boride, tantalum boride, niobium boride, titanium boride, and combinations thereof. Silicon carbide fibers have residual carbon which distinguishes the fibers compositionally from the silicon carbide coating layer which does not have carbon.

The first interface layer 24 includes silicon carbide. A portion of the silicon carbide layer is oxidized to form amorphous silicon dioxide. The additional coating layer 28, may include silicon carbide, zirconium, zirconium boride or a combination thereof.

The silicon carbide layer may have a thickness of 1000 nm to 20,000 nm, or, 2,000 nm to 10,000 nm. The silicon dioxide layer may have a thickness of 50 nm to 10,000 nm, or, 100 nm to 1,000 nm. The additional coating layer may have a thickness of 1000 nm to 20,000 nm, or, 2000 nm to 10,000 nm.

The silicon carbide layer is deposited on the ceramic fiber by chemical vapor deposition (shown as step 110). The combination of the silicon carbide layer and the ceramic fiber are then heat treated in the presence of oxygen to oxidize a portion of the silicon carbide layer to form a silicon dioxide 30 (shown as step 120) which is initially amorphous.

An additional coating layer or at least portion of the matrix is then deposited on the silicon dioxide layer (shown as step 130) by, for example, chemical vapor deposition, after which the fiber with the multilayer coating is subjected to a heat treatment (shown as step 140) to crystallize the silicon dioxide. Exemplary additional coating layer materials include zirconium, silicon carbide, zirconium boride or combinations thereof. Exemplary matrix materials include silicon carbide, aluminum oxide, mullite, cordierite, and combinations thereof.

The heat treatment crystallizes the silicon dioxide 30 and forms beta-cristobalite 26 and upon cooling (shown as step 150) alpha-cristobalite 32 forms with a volume reduction which results in micro cracking. Exemplary heat treatment temperatures (step 140) 1200 to 1650 ° C., or, 1300 to 1600° C. Exemplary times for the heat treatment include 1 minute to 100 hours, or, 1 minutes to 50 hours.

The micro cracks in the silicon dioxide coating layer provide protection to the fiber from matrix cracking by deflecting the cracks into the silicon dioxide layer. The first interlayer provides environmental protection to the fiber so the combination of layers results in a composite with more robust properties. The third layer, when present, protects the micro cracked second layer.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. The term "adjacent to" is defined as being in contact with the underlying material. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A coated ceramic fiber comprising:
   a first silicon carbide coating layer adjacent to the ceramic fiber, wherein a portion of the first silicon carbide coating layer is oxidized to form amorphous silicon dioxide;
   a silicon dioxide coating layer adjacent to the first silicon carbide coating layer, wherein the silicon dioxide coating layer includes the amorphous silicon dioxide; and
   an additional coating layer adjacent to the first silicon dioxide coating layer;
   wherein the additional coating layer adjacent to the silicon dioxide coating layer includes silicon carbide and is oppposedly disposed on a surface of the silicon dioxide from a surface that contacts the first silicon carbide coating layer,
   wherein the silicon dioxide coating layer forms micro cracks after a crystal structure transformation, and
   wherein the silicon dioxide coating layer includes silicon dioxide in β cristobalite form which forms micro cracks after transforming to α cristobalite form.

2. The coated ceramic fiber of claim 1, wherein the silicon dioxide coating layer has a thickness of 50 nm to 10,000 nm.

3. The coated ceramic fiber of claim 1, wherein the first silicon carbide coating layer has a thickness of 1000 nm to 20,000 nm.

4. The coated ceramic fiber of claim 1, wherein the additional coating layer adjacent to the silicon dioxide coating layer further includes zirconium, zirconium boride, or a combination thereof.

5. The coated ceramic fiber of claim 1, wherein the additional coating layer has the same composition as the first silicon carbide coating layer.

6. The coated ceramic fiber of claim 1, wherein the additional coating layer has a different composition from the first silicon carbide coating layer.

7. A composite material comprising:
   a ceramic matrix material and a plurality of ceramic fibers embedded within the ceramic matrix material;
   wherein the plurality of ceramic fibers comprise a multi-layer interface coating and the multi-layer interface coating comprises a first silicon carbide coating layer adjacent to the plurality of ceramic fibers, a portion of the first silicon carbide coating layer is oxidized to form amorphous silicon dioxide, and
   a silicon dioxide coating layer deposited onto the first silicon carbide coating layer, the silicon dioxide coating layer including the amorphous silicon dioxide,
   an additional interface coating layer adjacent to the silicon dioxide coating layer and oppposedly disposed on a surface of the silicon dioxide from a surface that contacts the first silicon carbide coating;
   wherein the additional interface coating layer includes silicon carbide,
   wherein the silicon dioxide coating layer forms micro cracks after a crystal structure transformation, and wherein the silicon dioxide coating layer includes silicon dioxide in β cristobalite form which forms micro cracks after transforming to α cristobalite form.

8. The composite material of claim 7, wherein the silicon dioxide coating layer has a thickness of 50 nm to 10,000 nm.

9. The composite material of claim 7, wherein the first silicon carbide coating layer has a thickness of 1000 nm to 20,000 nm.

10. The coated ceramic fiber of claim 7, wherein the additional interface coating layer has the same composition as the first silicon carbide coating layer.

11. The coated ceramic fiber of claim 7, wherein the additional interface coating layer has a different composition from the first silicon carbide coating layer.

12. The composite material of claim 7, wherein the additional coating layer adjacent to the silicon dioxide coating layer further includes zirconium, zirconium boride, or a combination thereof.

13. A method for forming a multi-layer interface coating onto a ceramic fiber comprising:

depositing a first silicon carbide coating layer onto the fiber, oxidizing a portion of the first silicon carbide coating layer to form an amorphous silicon dioxide coating layer, wherein the first silicon carbide coating layer is heat treated in the presence of oxygen to oxidize a portion of the first silicon carbide coating layer to form the amorphous silicon dioxide coating layer, depositing an additional coating layer on the silicon dioxide coating layer, wherein the additional coating layer on the silicon dioxide coating layer is opposedly disposed on a surface of the silicon dioxide from a surface that contacts the first silicon carbide coating layer; and crystallizing the amorphous silicon dioxide layer to beta cristobalite, wherein the crystallizing the amorphous silicon dioxide layer to beta cristobalite includes a heat treatment at 1200° C. to 1650°;

wherein the beta cristobalite forms micro cracks in the silicon dioxide coating layer after transforming to a cristobalite form; and wherein the additional coating layer includes silicon carbide.

* * * * *